United States Patent
Montaque et al.

(10) Patent No.: US 10,429,414 B2
(45) Date of Patent: Oct. 1, 2019

(54) MULTIPLE CONTACT PROBE HEAD DISASSEMBLY METHOD AND SYSTEM

(71) Applicant: GLOBALFOUNDRIES INC., Grand Cayman (KY)

(72) Inventors: Marvin G. L. Montaque, Essex Junction, VT (US); Stephen P. Ayotte, New Haven, VT (US); David L. Gardell, Fairfax, VT (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 711 days.

(21) Appl. No.: 15/013,106

(22) Filed: Feb. 2, 2016

(65) Prior Publication Data

US 2017/0219631 A1 Aug. 3, 2017

(51) Int. Cl.
*G01R 1/073* (2006.01)
*G01R 3/00* (2006.01)

(52) U.S. Cl.
CPC ............... *G01R 3/00* (2013.01); *G01R 1/073* (2013.01); *G01R 1/07357* (2013.01)

(58) Field of Classification Search
CPC .. G01R 3/00; G01R 1/07357; G01R 1/07371; G01R 1/07314; B01R 1/073; H01R 12/91
See application file for complete search history.

(56) References Cited

U.S. PATENT DOCUMENTS

| | | | |
|---|---|---|---|
| 5,692,873 A * | 12/1997 | Weeks | G03F 7/70691 204/298.15 |
| 5,977,787 A | 11/1999 | Das et al. | |
| 6,411,112 B1 | 6/2002 | Das et al. | |
| 6,523,255 B2 | 2/2003 | Shih et al. | |
| 2014/0062519 A1 | 3/2014 | Ding et al. | |
| 2016/0109483 A1* | 4/2016 | Bohm | H01R 12/91 324/755.05 |

* cited by examiner

*Primary Examiner* — David P Bryant
*Assistant Examiner* — Lee A Holly
(74) *Attorney, Agent, or Firm* — Michael LeStrange; Hoffman Warnick LLC

(57) ABSTRACT

A system and method for disassembling a multiple contact probe head including a plurality of contact probes positioned by a first die at a first end of the plurality of probes and a second die at a second end of the plurality of probes, are provided. The system may include a manifold configured to sealingly receive an opposing side of the first die from the second die; and a vacuum source operatively coupled to the manifold to apply a vacuum to an interior of the manifold applying a force to the plurality of contact probes in position in the first die across. Where the probes include a paramagnetic material, a magnetic source may be employed to hold the probes during disassembly.

9 Claims, 8 Drawing Sheets

MULTIPLE CONTACT PROBE HEAD DISASSEMBLY METHOD AND SYSTEM

BACKGROUND

Technical Field

The present disclosure relates to multiple contact probe tests, and more specifically, to a method and system for disassembling a multiple contact probe head.

Related Art

Multiple contact probe heads are used to test integrated circuit wafers during fabrication. As shown in FIG. 1, each probe head 10 includes a number of contact probes 12, referred to occasionally as cobra probes or buckling beam probes, that are positioned in a predetermined pattern by an upper die 14 and a lower die 16. Each die includes a number of holes (not referenced) that position a respective end of the probes. Probes 12 extend from upper die 14 to a device interface board 18, e.g., a substrate attached to printed circuit board with a ball grid array, which provides electrical interconnections to a test controller (not shown) that runs tests using the probes. Probes 12 also extend from lower die 16 to contact a wafer 20 for electrical testing performed using the probes. Probes 12, as shown in FIG. 2, can extend in a predetermined two-dimensional pattern.

Periodically the probe head must be disassembled for cleaning or to replace individual damaged cobra probe wires. Conventional techniques to disassemble the probe head do not adequately attempt to maintain the position of the probes, which can lead to the probes becoming accidentally disengaged, damaged, soiled, etc. For example, as shown in FIG. 3, current techniques typically apply a layer of tape 22 across lower ends of probes 12 to hold the probes in place. This approach typically leads to many probes being accidentally removed, damaged probes and foreign material (e.g., tape residue, dust, etc.) collecting on the probes. Consequently, a task of replacing a certain number of probes can turn into replacing a large multiple of the number intended.

SUMMARY

A first aspect of the disclosure is directed to a method for disassembling a multiple contact probe head including a plurality of contact probes positioned by a first die at a first end of the plurality of probes and a second die at a second end of the plurality of probes, the method including: applying a force to the plurality of contact probes in position in the first die across an opposing side of the first die from the second die; and removing the second die from the plurality of contact probes.

A second aspect of the disclosure includes a system for disassembling a multiple contact probe head including a plurality of contact probes positioned by a first die at a first end of the plurality of probes and a second die at a second end of the plurality of probes, the system including: a manifold configured to sealingly receive an opposing side of the first die from the second die; and a vacuum source operatively coupled to the manifold to apply a vacuum to an interior of the manifold applying a force to the plurality of contact probes in position in the first die across.

A third aspect of the disclosure related to a system for disassembling a multiple contact probe head including a plurality of contact probes positioned by a first die at a first end of the plurality of probes and a second die at a second end of the plurality of probes, the system including: a magnetic source configured to be positioned adjacent the first end of the plurality of probes and magnetically hold the plurality of contact probes during removal of the second die, wherein each of the plurality of probes includes a paramagnetic material.

The foregoing and other features of the disclosure will be apparent from the following more particular description of embodiments of the disclosure.

BRIEF DESCRIPTION OF THE DRAWINGS

The embodiments of this disclosure will be described in detail, with reference to the following figures, wherein like designations denote like elements, and wherein.

DETAILED DESCRIPTION

Figure 4:
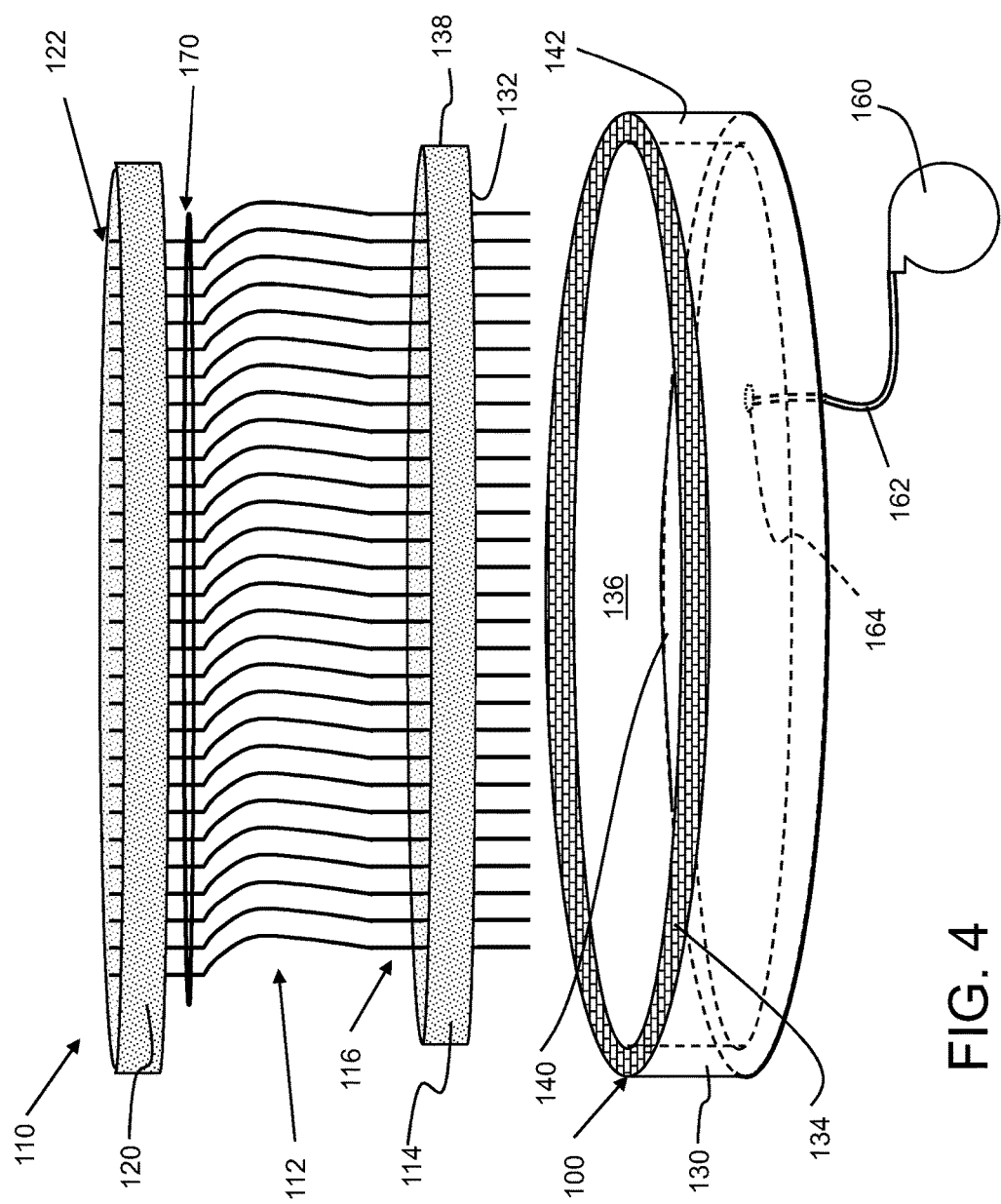
FIG. 4 shows a perspective view of a disassembly system for a multiple contact probe head according to embodiments of the disclosure.
Figure 5:
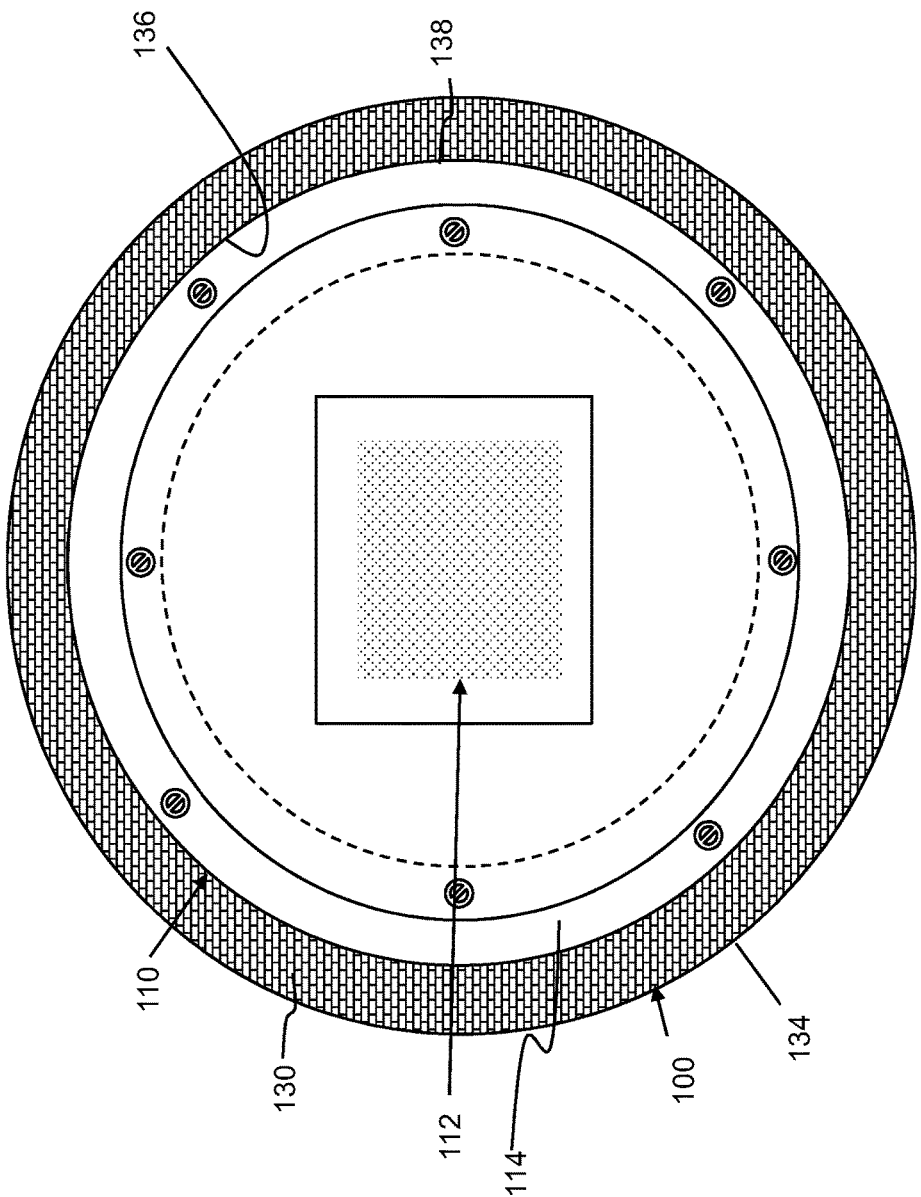
FIG. 5 shows a plan view of a disassembly system for a multiple contact probe head according to embodiments of the disclosure.
Figure 6:
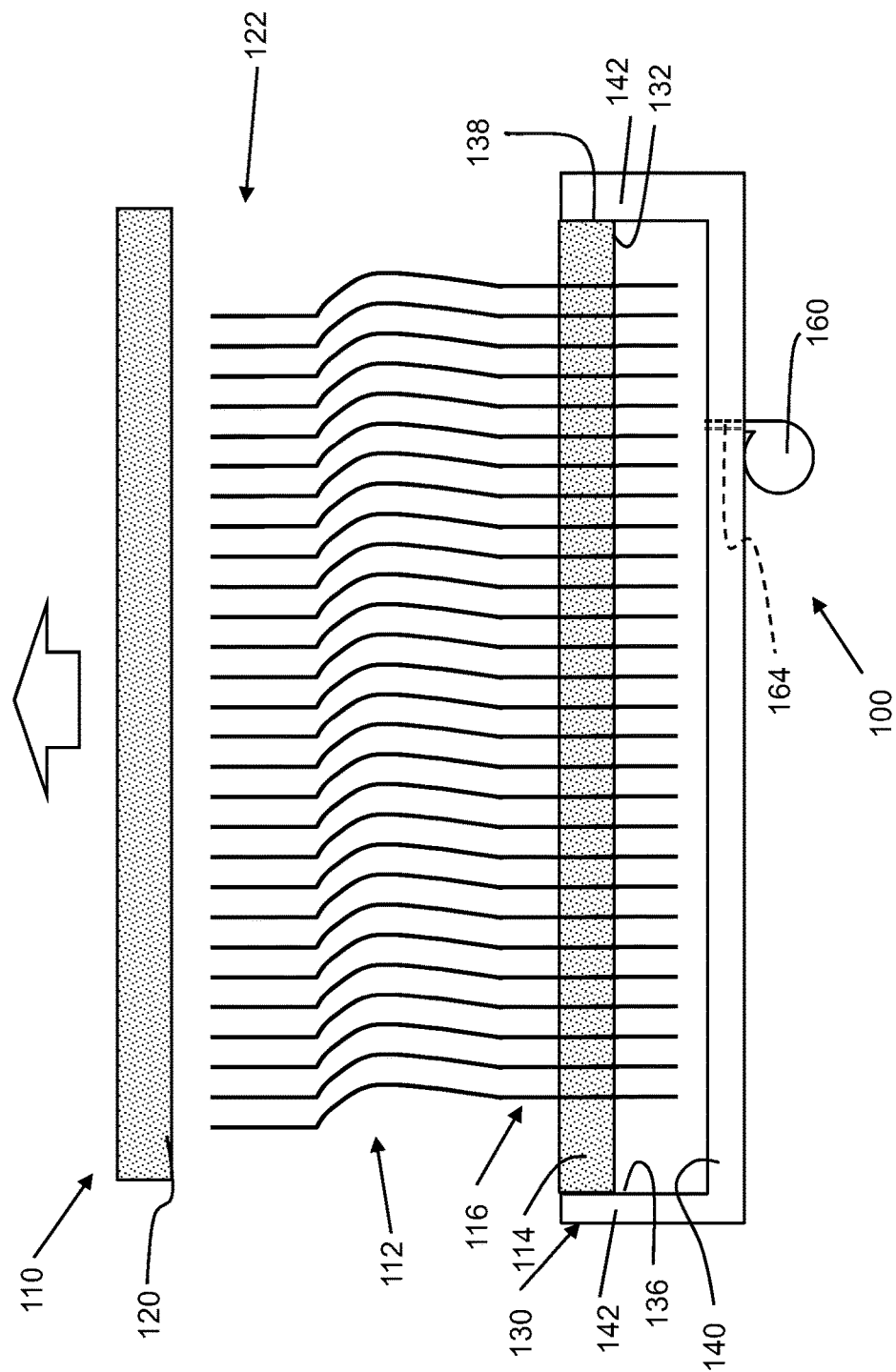
FIG. 6 shows a cross-sectional view of a disassembly system for a multiple contact probe head according to embodiments of the disclosure.

Referring to FIGS. 4-6, embodiments of a system 100 and method for disassembling a multiple contact probe head 110 is illustrated. Probe head 110 may include a plurality of contact probes 112 positioned by a first die 114 at a first end 116 of the plurality of probes and a second die 120 at a second end 122 of the plurality of probes. FIGS. 4 and 6 show perspective views of probe head 110 in a disassembled state, and FIG. 5 shows a plan view of system 100 including first die 114 therein. As illustrated, dies 114, 120 may be substantially circular in plan view; however this may not be necessary in all instances. As illustrated, first die 114 represents a lower die and second die 120 represents an upper die; however, this arrangement is not necessary in all instances. In one example, each die 114, 122 may have a width or diameter of approximately 76 millimeters (approximately 3 inches). As used herein, "approximately" indicates +/−20% of the value(s) stated. Contact probes 112 may include any now known or later developed probe such as those referred to as cobra probes or buckling beam probes. As understood, probes 112 are set in openings (not numbered for clarity) in dies 114, 120 to position the probes for contact with an integrated circuit wafer. Probes 112 can include any number of probes, which can range from hundreds to tens of thousands. The area that probes 112 cover can vary depending on the application, but may be, for example, approximately 645 square millimeters (1 square inch).

Referring to FIG. 4, probe head 110 may also include a template 170 which may include a layer of, for example, Kapton® available from DuPont, Wilmington, Del., with holes for ends of probes 112 to pass through. Template 170 is used during assembly to align all probes 112 to holes in second die 120 during assembly.

Figure 1:
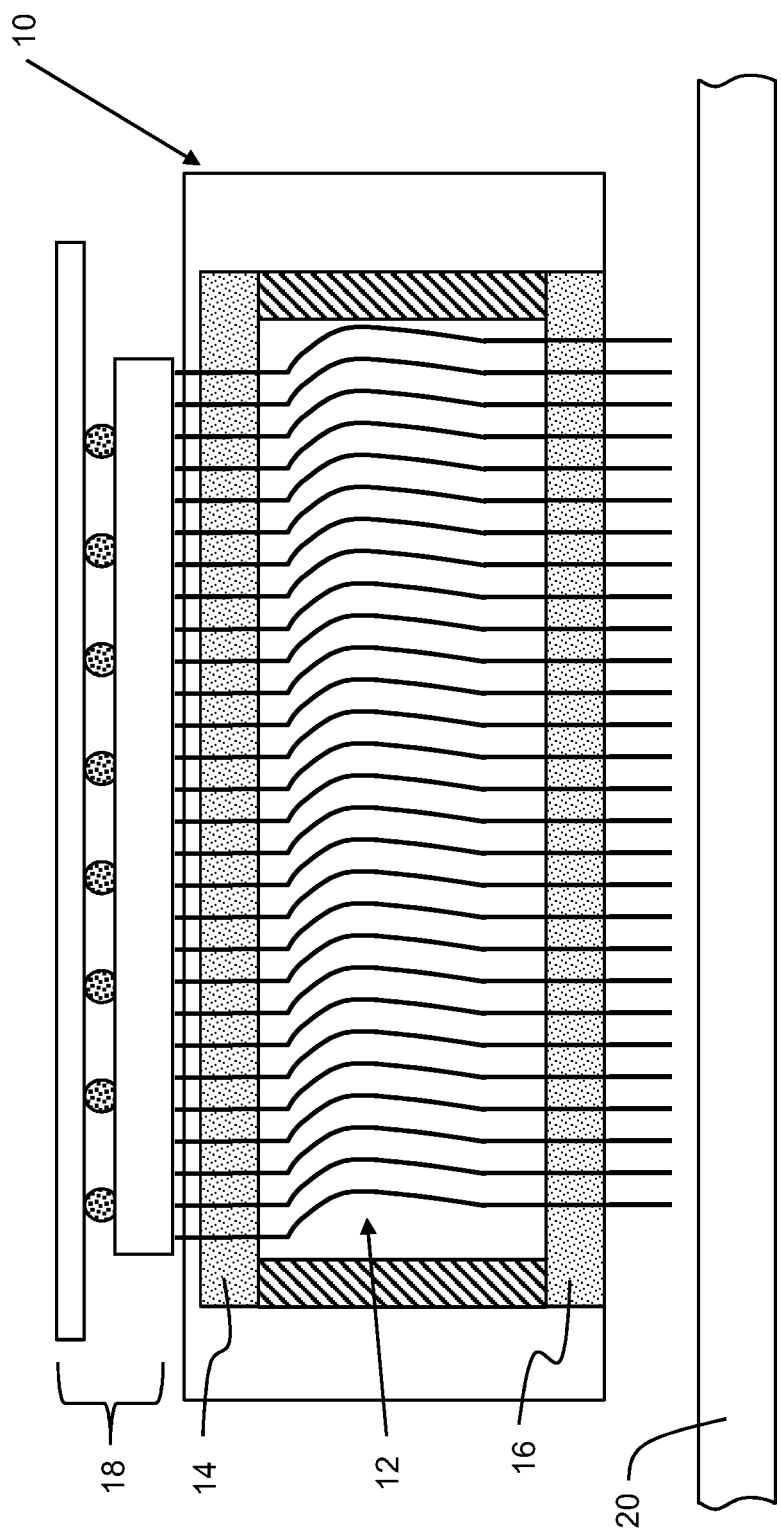
FIG. 1 shows a cross-sectional view of a conventional multiple contact probe head.
Figure 2:
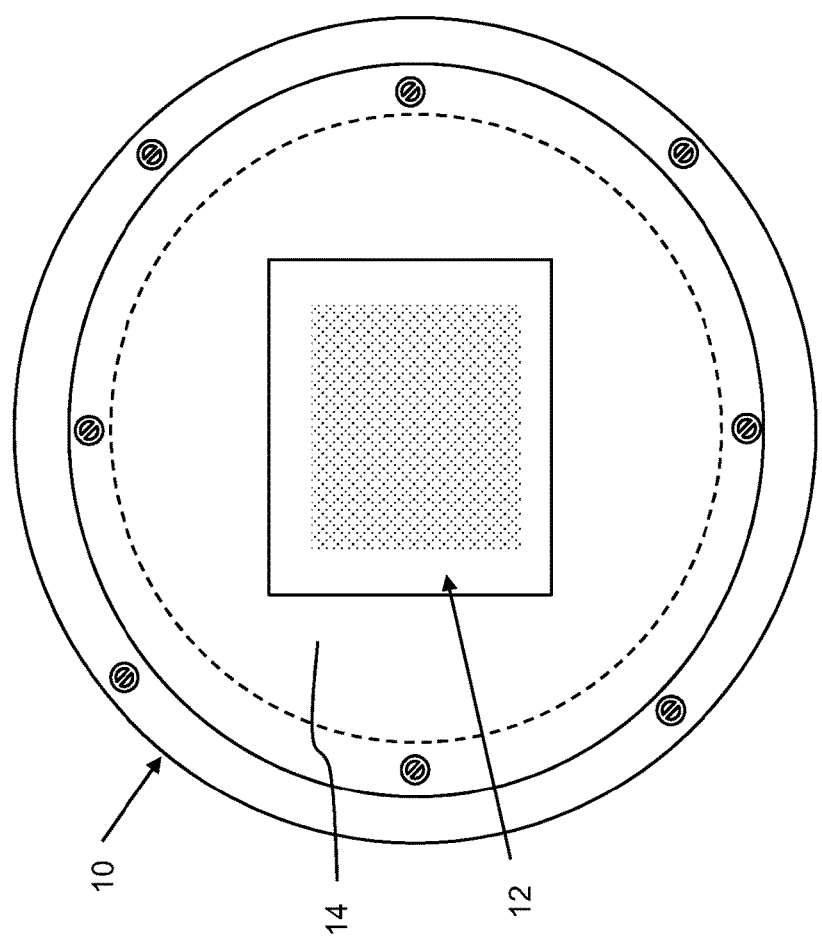
FIG. 2 shows a plan view of a conventional multiple contact probe head.
Figure 3:
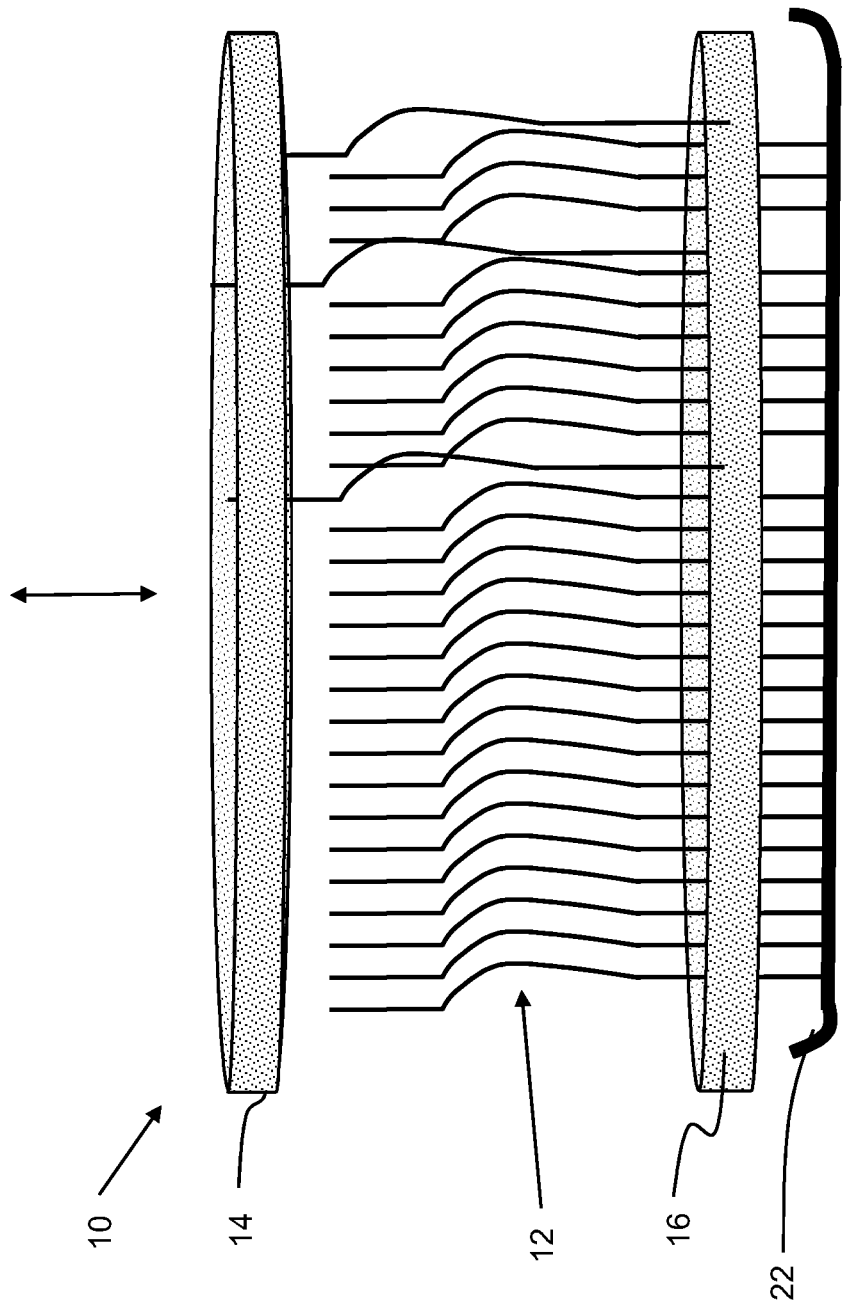
FIG. 3 shows a perspective view of a conventional multiple contact probe head in a disassembled state.
Figure 7:
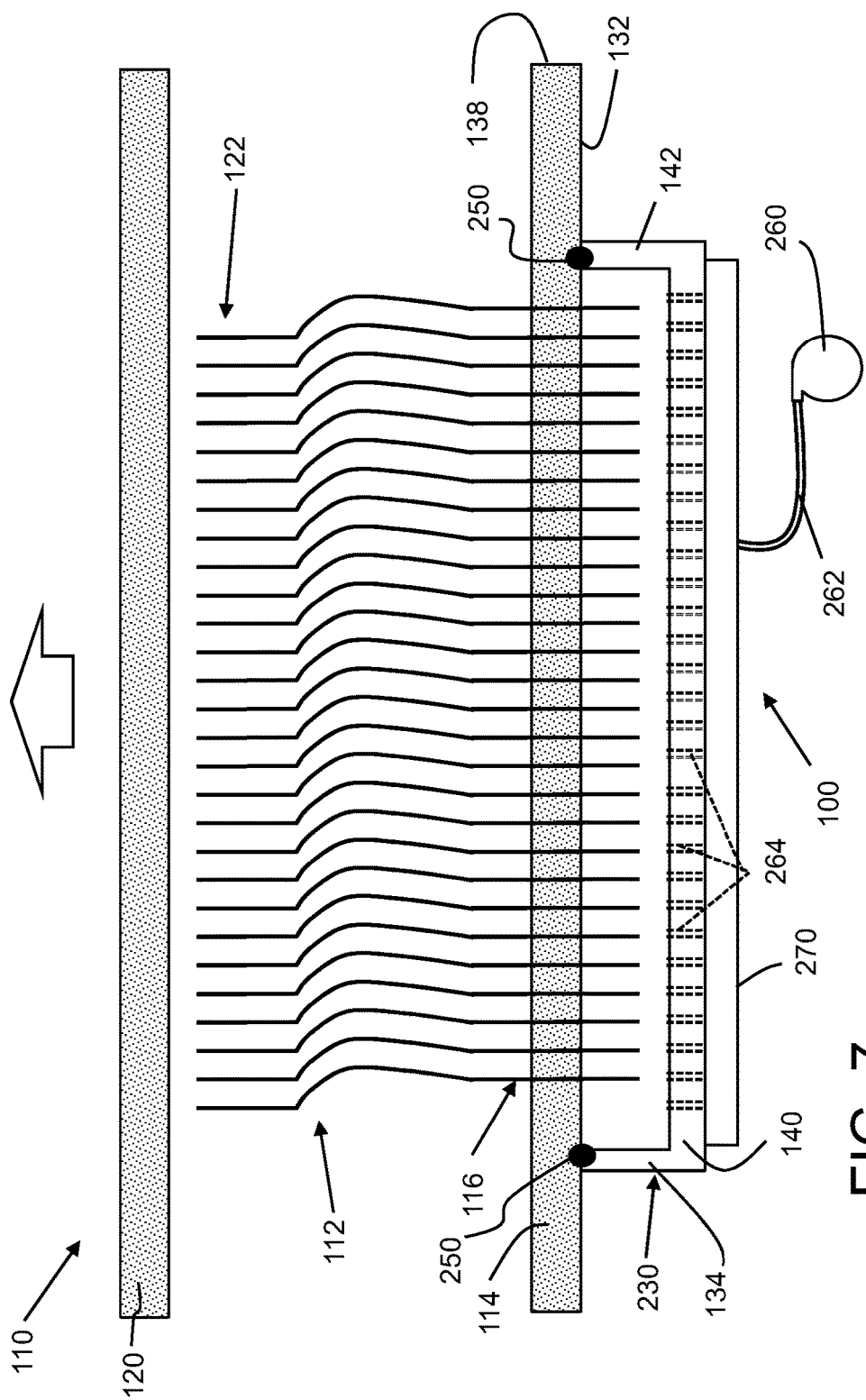
FIG. 7 shows a cross-sectional view of a disassembly system for a multiple contact probe head according to another embodiment of the disclosure.

As shown in FIGS. 4-7, system 100 may include a manifold 130 configured to sealingly receive an opposing side 132 of first die 114 from second die 120. Opposing side 132 of first die 114 faces away from second die 120 and is the side from which second end 116 of contact probes extend to contact an IC wafer 20 (FIG. 1). Probes 112 may extend from opposing side 132 at a variety of lengths depending on the application, e.g., less than 1 mm and typically approximately 0.1 mm to 0.5 mm. Manifold 130 may take a variety of forms. In one embodiment, shown in FIGS. 4 and 5, manifold 130 may include a cup-shaped element 134 configured to have an internal periphery 136 shaped to sealingly receive an outer periphery 138 of first die 114. That is, as shown best in FIG. 6, manifold 130 has an end wall 140 and a circular wall 142 extending therefrom that defines inner periphery 136. Peripheries 136, 138 may be sized so that the amount of air passing between internal periphery 136 and outer periphery 138 is small relative to an amount of air supplied by a vacuum source 160 thus maintaining a desired pressure. In an alternative embodiment, as shown in FIG. 7, a manifold 230 may include substantially similar structure to manifold 130 of FIG. 4-6, except manifold 230 sealingly engages a surface of opposing side 132 of first die 114, i.e., outside of probes 112 but internal to any mounting hardware such as screws (see FIG. 5) that couple dies 114, 120 together. In this case, manifold 230 may include an O-ring 250 about an upper surface thereof, i.e., along an upper surface of wall 142. In any event, manifold 130, 230 seals against opposing side 132 of first die 114 where probes 112 extend therefrom.

System 100 also includes vacuum source 160, 260 operatively coupled to manifold 130, 230, respectively, to apply a vacuum to an interior of the manifold applying a force to the plurality of contact probes 112 in position in first die 114. Vacuum source 160 may include any industrial vacuum system capable of applying to a negative pressure sufficient to maintain probes 112 in first die 114 when second die 120 is removed from probes 112, as shown in FIGS. 6 and 7. In one embodiment, vacuum source 160 may apply a negative pressure of approximately 8,000 Pascal (Pa) to approximately 80,000 Pa. Vacuum source 160 may also be adjustable so as to accommodate any possible application expectations, e.g., different first die 114 dimensions, different probe 112 sizes, different numbers of probes 112, etc. In this fashion, vacuum source 160 may be activated and adjusted to each application. Vacuum source 160 may be coupled to manifold 130, 230 in any now known or later developed fashion, e.g., by direct coupling thereto as shown in FIG. 6 or by one or more conduit(s) 162, 262, as shown in FIGS. 4 and 7, respectively. As shown in FIGS. 4 and 6, in one embodiment, manifold 130 may include a single vacuum applying opening 164 for coupling to vacuum source 160, and in an alternative embodiment, as shown in FIG. 7, manifold 230 may include a plurality of vacuum applying openings 264 coupled to vacuum source 160. In the latter embodiment, a sub-manifold 270 may be employed to provide negative pressure to openings 264. It is emphasized that the different features of each embodiment may be selectively used across the various embodiments, e.g., multiple openings 264 with direct vacuum source 160 coupling.

Figure 8:
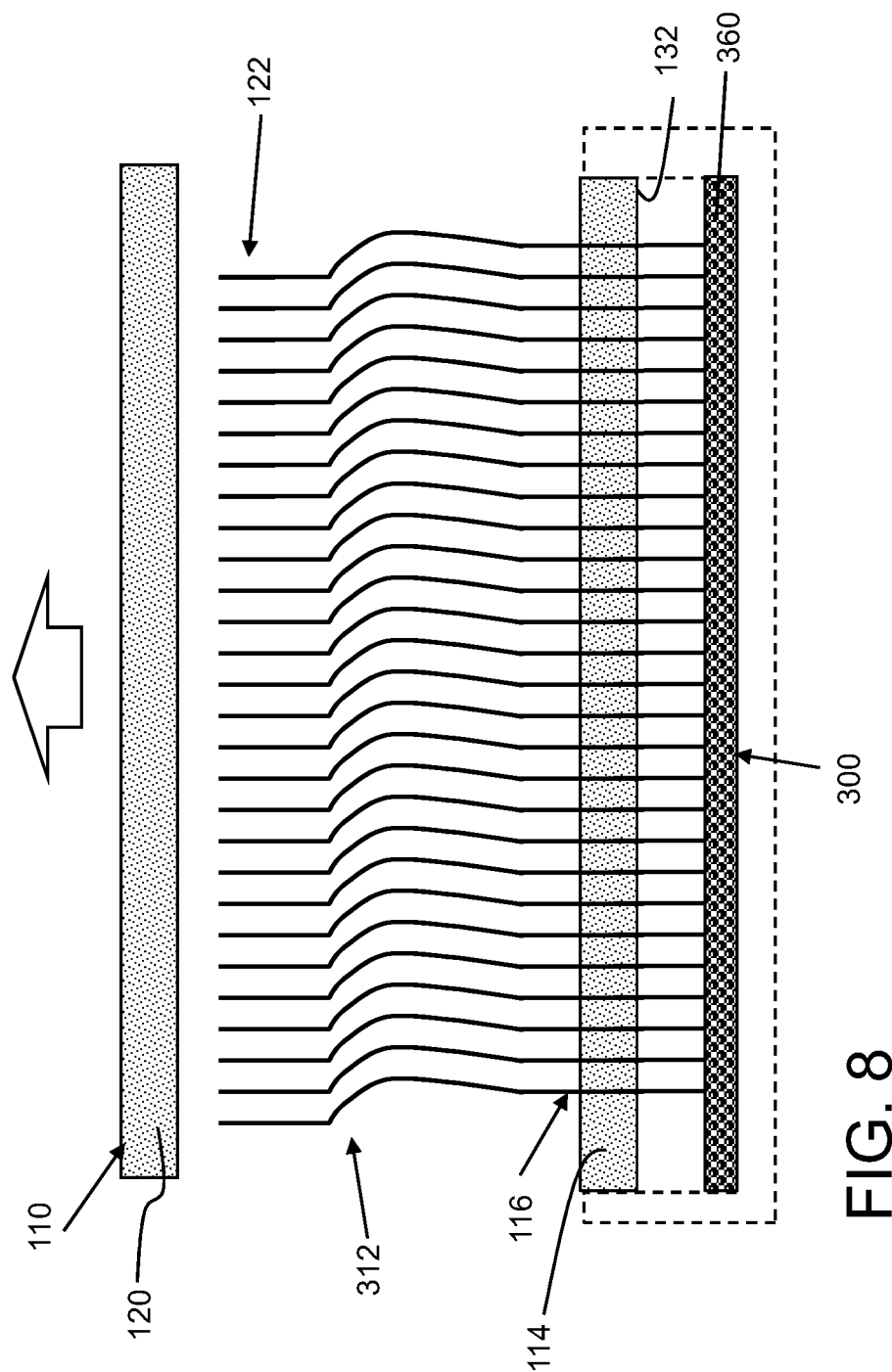
FIG. 8 shows a cross-sectional view of a disassembly system for a multiple contact probe head according to yet another embodiment of the disclosure.

Turning to FIG. 8, in an alternative embodiment, a system 300 for disassembling a multiple contact probe head 110 is illustrated. In this embodiment, probes 312 are structurally similar to probes 112 (FIGS. 4-7), but include a magnetic or paramagnetic material. Paramagnetic material may include any material capable of attraction to a small, positive magnetic field such as but not limited to magnesium, molybdenum, lithium, and tantalum. In this case, since probes 312 include a paramagnetic material, they can be influenced by a magnetic field. A magnetic probe 312 would further increase the force but may need the additional step of demagnetizing the probes after re-assembly is complete. Here, system 300 may include a magnetic source 360 configured to be positioned adjacent first end 116 of plurality of probes 312. Magnetic source 360 acts to magnetically hold contact probes 312 during removal of second die 120. Magnetic source 360 can have any magnetic field force capable of holding probes 312 in position, which will depend on the size, geometry and material of the probes and/or the magnetic source. In one example, the amount of necessary magnetic force could be approximately 0.1 grams per probe to approximately 20 grams to probe. Magnetic source 360 may be provided alone or with some mount (in phantom in FIG. 8), similar to manifold 130. Magnetic source 360 can include any form of magnetic field generation, e.g., a magnetic material, an adjustable electromagnet, etc.

In operation, a force may be applied to contact probes 112, 312 in position in first die 114 across opposing side 132 of first die 114 from second die 120, using system 100 with a force applied by a vacuum source 160 or using system 300 with a force applied by a positive magnetic force such as magnetic source 360. Once the force is applied, as shown in FIGS. 6-8, second die 120 may be removed from contact probes 112, 312.

Vacuum source 160 or magnetic source 360 will create a stable force that holds probes 112, 312 so probe head 110 can be disassembled. Systems 100, 300 using a vacuum or magnetic field for probe head 110 disassembly prevents probe from unplanned disassembly. Systems 100, 300 also leave probes uncontaminated and untouched, and thus prevents damage to probes 112, 312.

The method as described above is used in the fabrication of integrated circuit chips.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method for disassembling a multiple contact probe head including a plurality of contact probes positioned by a first die at a first end of the plurality of probes and a second die at a second end of the plurality of probes, the method comprising:
   applying a force to the plurality of contact probes in position in the first die across an opposing side of the first die from the second die; and
   removing the second die from the plurality of contact probes by extracting the plurality of contact probes from one or more openings in the second die.

2. The method of claim 1, wherein the applying the force includes applying a vacuum across the opposing side of the first die from the second die.

3. The method of claim 2, wherein the applying the vacuum includes sealingly positioning a manifold about the first die, and applying the vacuum to an interior of the manifold.

4. The method of claim 3, wherein the manifold includes a plurality of vacuum applying openings.

5. The method of claim 2, wherein the applying the vacuum includes sealingly positioning a manifold against the first die, and applying the vacuum to an interior of the manifold.

6. The method of claim 2, further comprising adjusting the applying the vacuum.

7. The method of claim 1, wherein each of the plurality of contact probes includes a paramagnetic material, and the applying the force includes applying an attractive magnetic force to the plurality of contact probes extending from the opposing side of the first die from the second die.

8. The method of claim 1, wherein removing the second die includes extracting the plurality of contact probes from one or more openings in the second die.

9. A method for disassembling a multiple contact probe head including a plurality of contact probes positioned by a first die at a first end of the plurality of probes and a second die at a second end of the plurality of probes, wherein at least a portion of the plurality of contact probes extends through one or more openings in the second die, the method comprising:

sealingly positioning a manifold against the first die;

applying a vacuum to the interior of the manifold, such that a force is applied across the opposing side of the first die from the second die and to the plurality of contact probes in position in the first die; and removing the second die from the plurality of contact probes.

* * * * *